(12) United States Patent
Shim

(10) Patent No.: US 8,110,849 B2
(45) Date of Patent: Feb. 7, 2012

(54) LIGHT EMITTING DEVICE AND METHOD OF MANUFACTURING THE SAME

(75) Inventor: Sang Kyun Shim, Jeonju-si (KR)

(73) Assignee: LG Innotek Co., Ltd., Seoul (KR)

( * ) Notice: Subject to any disclaimer, the term of this patent is extended or adjusted under 35 U.S.C. 154(b) by 121 days.

(21) Appl. No.: 12/550,789

(22) Filed: Aug. 31, 2009

(65) Prior Publication Data
US 2010/0052009 A1  Mar. 4, 2010

(30) Foreign Application Priority Data
Sep. 1, 2008 (KR) .................. 10-2008-0085885

(51) Int. Cl.
*H01L 33/00* (2010.01)
(52) U.S. Cl. ............. 257/103; 257/79; 257/90; 257/91; 257/E33.005; 257/E33.016
(58) Field of Classification Search .............. 257/79, 257/90–91, 103
See application file for complete search history.

(56) References Cited

U.S. PATENT DOCUMENTS

| | | |
|---|---|---|
| 2006/0270206 A1 | 11/2006 | Cho et al. |
| 2007/0206651 A1* | 9/2007 | Tsai et al. .................. 372/45.01 |
| 2008/0093617 A1 | 4/2008 | Song et al. |
| 2008/0121914 A1 | 5/2008 | Seong et al. |
| 2008/0185608 A1* | 8/2008 | Chitnis .......................... 257/99 |
| 2008/0258174 A1* | 10/2008 | Seong .......................... 257/184 |
| 2008/0259980 A1* | 10/2008 | Wierer et al. .............. 372/44.01 |
| 2008/0303055 A1* | 12/2008 | Seong .......................... 257/103 |
| 2009/0224282 A1* | 9/2009 | Kamei .......................... 257/103 |
| 2010/0059760 A1* | 3/2010 | Miki .............................. 257/76 |
| 2010/0148197 A1* | 6/2010 | Bour et al. ...................... 257/98 |

FOREIGN PATENT DOCUMENTS

| | | |
|---|---|---|
| JP | 10-51070 | * 2/1998 |
| JP | 2008-177514 | * 7/2008 |
| KR | 10-2006-0007944 A | 1/2006 |
| KR | 10-0611640 B1 | 8/2006 |
| KR | 10-2006-0119159 A | 11/2006 |
| KR | 10-2008-0035215 A | 4/2008 |
| WO | WO 2007074969 | * 7/2007 |

* cited by examiner

*Primary Examiner* — A. Sefer
(74) *Attorney, Agent, or Firm* — Birch, Stewart, Kolasch & Birch, LLP

(57) ABSTRACT

A light emitting device is provided. The light emitting device comprises a first conductive semiconductor layer, an active layer, and a second conductive semiconductor layer, and an InNO layer. The active layer is disposed on the first conductive semiconductor layer. The second conductive semiconductor layer is disposed on the active layer. The InNO layer is disposed on the second conductive semiconductor layer.

5 Claims, 2 Drawing Sheets

LIGHT EMITTING DEVICE AND METHOD OF MANUFACTURING THE SAME

CROSS-REFERENCE TO RELATED APPLICATIONS

The present application claims priority under 35 U.S.C. 119(e) and 35 U.S.C. 365 to Korean Patent Application No. 10-2008-0085885 (filed on Sep. 1, 2008), which is hereby incorporated by reference in its entirety.

BACKGROUND

The present disclosure relates to a light emitting device.

Extensive research has been conducted recently on devices that use Light Emitting Diodes (LEDs) as devices for emitting light.

LEDs use the characteristics of compound semiconductors to convert electrical signals into light. LEDs have a structure in which a first conductive semiconductor layer, an active layer, and a second conductive semiconductor layer are stacked. Here, a power source is applied to the structure to emit light from the active layer.

A first conductive semiconductor layer becomes an N-type semiconductor layer, and a second conductive semiconductor layer becomes a P-type semiconductor layer. Alternatively, a first conductive semiconductor layer may become a P-type semiconductor layer, and a second conductive semiconductor layer may become an N-type semiconductor layer.

On the other hand, an indium-tin oxide (ITO) layer is formed on the second conductive semiconductor layer so that light generated in the active layer may be effectively emitted to the outside. However, high resistance of the ITO layer increases the operating voltage of the LED, thereby increasing power consumption and generated heat.

SUMMARY

Embodiments provide a light emitting device having improved light emission efficiency.

Embodiments also provide a light emitting device having reduced contact resistance between a second conductive semiconductor layer and a second electrode layer.

Embodiments also provide a light emitting device having reduced power consumption and generated heat.

In an embodiment, a light emitting device comprises: a first conductive semiconductor layer; an active layer on the first conductive semiconductor layer; a second conductive semiconductor layer on the active layer; and an InNO layer on the second conductive semiconductor layer.

In an embodiment, a light emitting device comprises: a first conductive semiconductor layer; an active layer on the first conductive semiconductor layer; a second conductive semiconductor layer on the active layer; and an InGaNO layer on the second conductive semiconductor layer.

In an embodiment, a light emitting device comprises: a first conductive semiconductor layer; an active layer on the first conductive semiconductor layer; a second conductive semiconductor layer on the active layer; and an oxide layer including nitrogen on the second conductive semiconductor layer.

The details of one or more embodiments are set forth in the accompanying drawings and the description below. Other features will be apparent from the description and drawings, and from the claims.

DETAILED DESCRIPTION OF THE EMBODIMENTS

Figure 1:
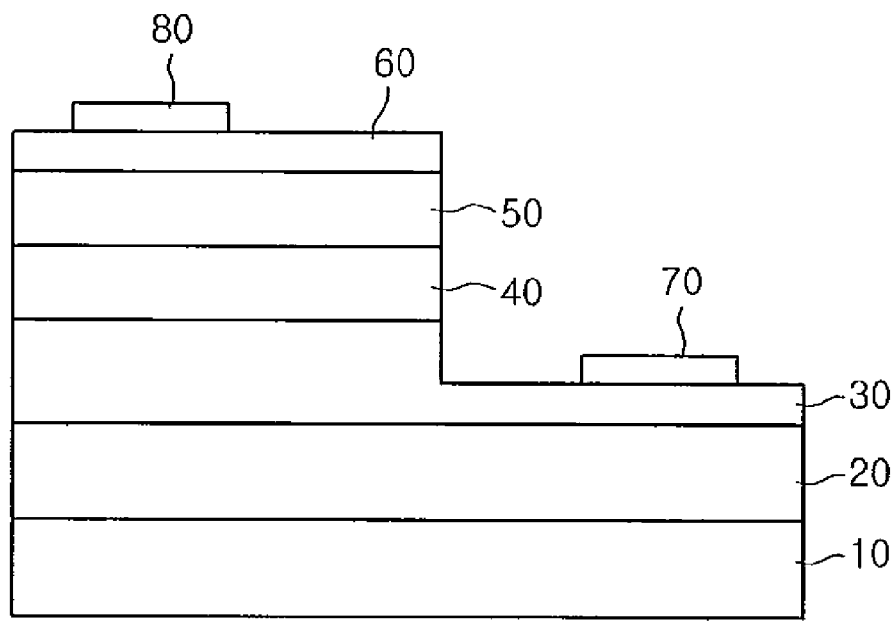
FIG. 1 is a cross-sectional view of a light emitting device according to a first embodiment.

In the description of embodiments, it will be understood that when a layer (or film), region, pattern or structure is referred to as being 'on' or 'under' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device according to the embodiments will be described in detail with reference to the accompanying drawings.

FIG. 1 is a cross-sectional view of a light emitting device according to a first embodiment.

Referring to FIG. 1, the light emitting device according to the first embodiment includes a substrate 10, a buffer layer 20 on the substrate 10, a first conductive semiconductor layer 30 on the buffer layer 20, an active layer 40 on the first conductive semiconductor layer 30, a second conductive semiconductor layer 50 on the active layer 40, and an oxide layer 60 on the second conductive semiconductor layer 50.

Also, the light emitting device includes a first electrode layer 70 on the first conductive semiconductor layer 30, and a second electrode layer 80 on the oxide layer 60.

In the light emitting device, the oxide layer 60 is disposed between the second electrode layer 80 and the second conductive semiconductor layer 50.

The oxide layer 60 reduces the contact resistance generated between the second electrode layer 80 and the second conductive semiconductor layer 50 to reduce an operating voltage of the light emitting device. Accordingly, power consumption and generated heat of the light emitting device may be reduced, and light emission efficiency may be increased.

The oxide layer 60 includes an InNO layer or an InGaNO layer.

For example, the InNO layer may be formed by forming an InN layer on the second conductive semiconductor layer 50 and oxidizing the InN layer.

For example, the InGaNO layer may be formed by forming an In rich InGaN layer on the second conductive semiconductor layer 50 and oxidizing the In rich InGaN layer. The In rich InGaN layer may become an $In_xGa_{1-x}N$ layer (where $0.7 \leq x < 1$), and the InGaNO layer may become an $In_xGa_{1-x}NO$ layer (where $0.7 \leq x < 1$).

Hereinafter, a method of manufacturing the light emitting device as described above will be fully described.

A substrate 10 is prepared. A buffer layer 20 is formed on the substrate 10.

The substrate 10 may be formed of at least one of $Al_2O_3$, Si, SiC, GaAs, ZnO, and MgO.

The buffer layer 20 reduces a difference of the lattice constant between the substrate 10 and a semiconductor layer on the substrate 10. For example, the buffer layer 20 may be formed in a stacked structure such as AlInN/GaN, $In_xGa_{1-x}$N/GaN and $Al_xIn_yGa_{1-x-y}$N/$In_xGa_{1-x}$N/GaN.

The buffer layer 20 may be formed by injecting TMGa and TMIn of $3\times10^5$ mol/min, and TMAl of $3\times10^6$ mol/min in addition to a hydrogen gas and an ammonia gas into a chamber where the substrate 10 is located.

Also, an undoped GaN layer may be formed between the buffer layer 20 and the first conductive semiconductor layer 30.

A first conductive semiconductor layer 30, an active layer 40 and a second conductive semiconductor layer 50 are formed on the buffer layer 20.

The first conductive semiconductor layer 30 may be a nitride semiconductor layer doped with a first conductive impurity. For example, the first conductive semiconductor layer may be formed by providing a silane gas ($SiH_4$) including $NH_3$ ($3.7\times10^{-2}$ mol/min), TMGa ($1.2\times10^{-4}$ mol/min), and an N-type impurity such as Si.

The active layer 40 may be formed in a single quantum well structure or a multiple quantum well structure, or may be formed in a stacked structure of InGaN well layer/GaN barrier layer. For example, the active layer 40 may be formed at an atmosphere of nitrogen by injecting a trimethyl gallium and a trimethyl indium using a Metal Organic Chemical Vapor Deposition (MOCVD).

The second conductive semiconductor layer 50 may be a nitride semiconductor layer doped with a second conductive impurity. For example, the second conductive semiconductor layer 50 may be formed by supplying a TMGa gas ($7\times10^{-6}$ mol/min), bis-ethylcyclopentadienyl magnesium $EtCp_2Mg$ $\{Mg(C_2H_5C_5H_4)_2\}$ ($5.2\times10^{-7}$ mol/min), and $NH_3$ ($2.2\times10^{-1}$ mol/min) using a hydrogen gas as a carrier gas.

The oxide layer 60 is formed on the second conductive semiconductor layer 50.

The oxide layer 60 may be formed using an InNO layer or an InGaNO layer. The InNO layer or InGaNO layer is formed by performing an oxidation process on an InN layer and or an In rich InGaN layer after forming the InN layer or the In rich InGaN layer on the second conductive semiconductor layer 50.

The InN layer is formed by injecting a TMIn gas and an $NH_3$ gas into MOCVD equipment at a temperature of about 400☐ to about 700☐. The In rich InGaN layer is formed by injecting a TMIn gas, a TMGa gas and an $NH_3$ gas into MOCVD equipment at a temperature of about 400☐ to about 700☐.

The oxidation process may be performed through a dry oxidation process under an $O_2$ atmosphere in RTP equipment, PECVD equipment, and RIE equipment. According to another embodiment, the oxidation process may be performed through a wet oxidation process.

Next, the oxide layer 60, the second conductive semiconductor layer 50, the active layer 40, and the first conductive semiconductor layer 30 are selectively removed through a mesa etching to upwardly expose a portion of the first conductive semiconductor layer 30.

Then, a first electrode layer 70 is formed on the first conductive semiconductor layer 30, and a second electrode layer 80 is a oxide layer 60.

Accordingly, the light emitting device as described in FIG. 1 according to the first embodiment may be manufactured.

Figure 2:
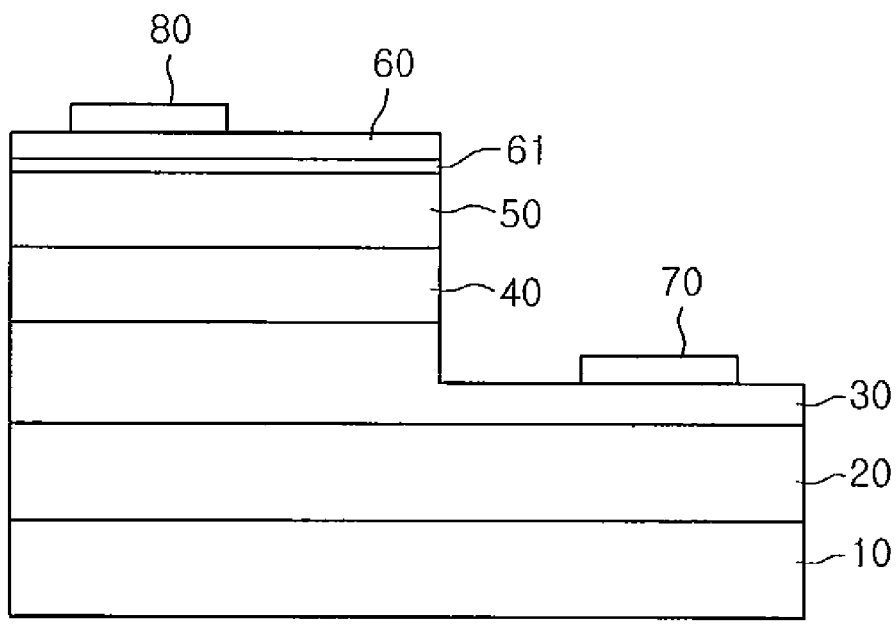
FIG. 2 is a cross-sectional view of a light emitting device according to a second embodiment.

FIG. 2 is a cross-sectional view of a light emitting device according to a second embodiment. Hereinafter, only the difference from the first embodiment will be described.

Referring to FIG. 2, the light emitting device according to the second embodiment includes an InN layer or an In rich InGaN layer 61 between an oxide layer 60 and a second conductive semiconductor layer 50.

While, in the first embodiment, the oxide layer 60 is disposed on the second conductive semiconductor layer 50 by forming an InN layer or an InGaN layer to completely oxidize into an InNO layer or an InGaNO layer, the oxide layer 60 is formed by partially oxidizing only an upper portion of the InN layer or the In rich InGaN layer 61 to form an oxide layer 60, InNO layer or In rich InGaNO layer in the second embodiment.

That is, in the second embodiment, the InN layer or In rich InGaN layer 61 is formed on the second conductive semiconductor layer 50, and the oxide layer 60 is formed on the InN layer or the In rich InGaN layer 61.

Figure 3:
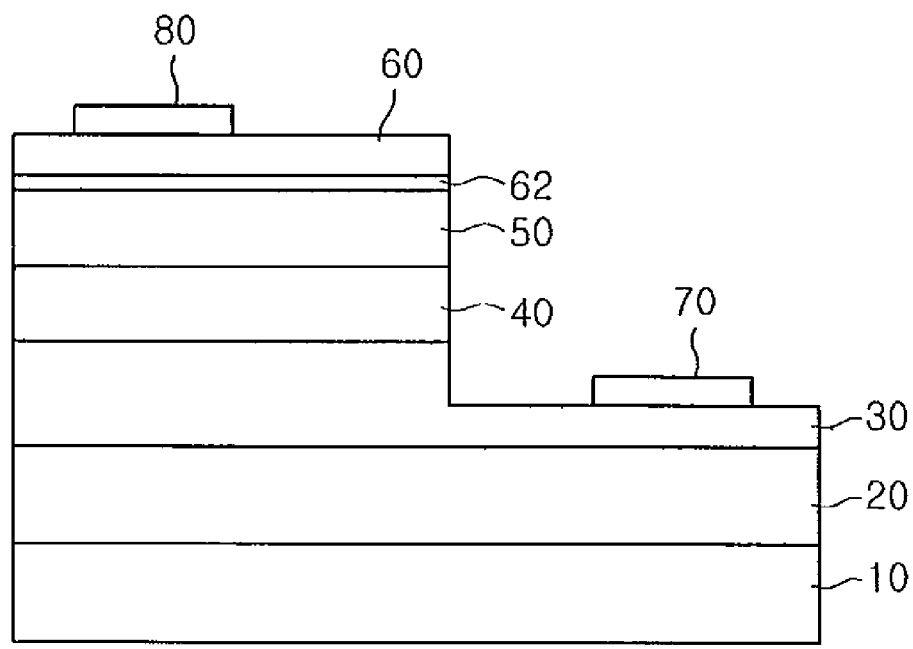
FIG. 3 is a cross-sectional view of a light emitting device according to a third embodiment.

FIG. 3 is a cross-sectional view of a light emitting device according to a third embodiment. Hereinafter, only the difference from the first embodiment will be described.

Referring FIG. 3, the light emitting device according to the third embodiment includes a third conductive semiconductor layer 62 between an oxide layer 60 and a second conductive semiconductor layer 50.

The oxide layer 60 is formed of an InNO layer or an InGaNO layer to have strong characteristics of an N-type impurity. However, the contact resistance may be high. In order to complement this, the third conductive semiconductor layer 62 is disposed between the oxide layer 60 and the second conductive semiconductor layer 50.

The third conductive semiconductor layer 62 may be formed of a GaN layer or an InGaN layer including an N-type impurity, Si, and be formed in a thickness of about 2 nm to about 10 nm.

The third conductive semiconductor layer 62 can enhance the current spreading effect.

Figure 4:
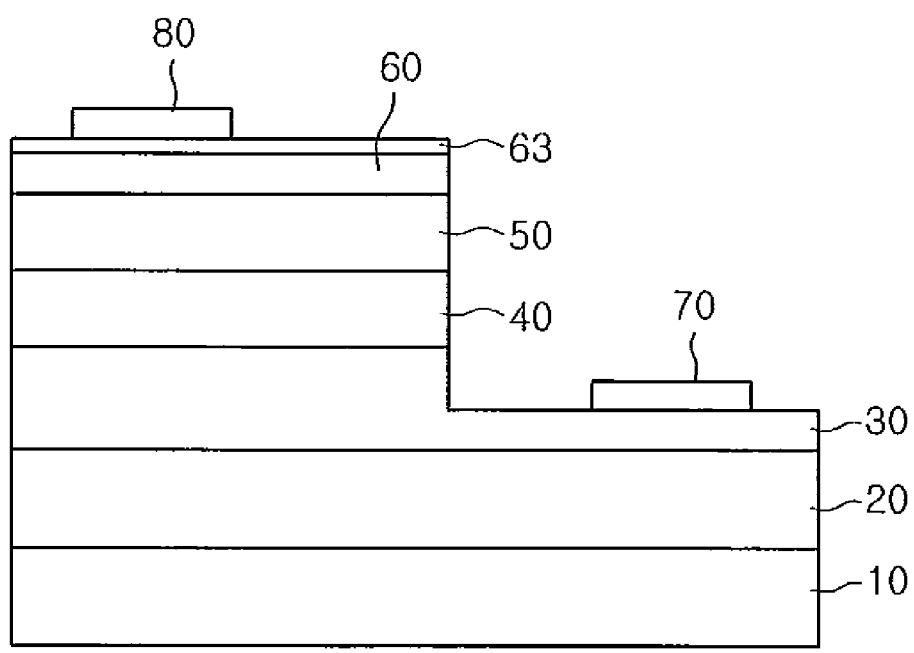
FIG. 4 is a cross-sectional view of a light emitting device according to a fourth embodiment.

FIG. 4 is a cross-sectional view of a light emitting device according to a fourth embodiment. Hereinafter, only the difference from the first embodiment will be described.

Referring to FIG. 4, the light emitting device according to the fourth embodiment includes an indium-tin oxide (ITO) layer 63 on an oxide layer 60, having a different composition from the oxide layer 60.

Since being disposed on the oxide layer 60, the ITO layer 63 has an advantage of smaller contact resistance than an ITO layer disposed on a second conductive semiconductor layer in the related-art.

In above first to fourth embodiment, the oxide layer 60 may be formed in a thickness of about 1 nm to about 100 nm by oxidizing an InN layer or an In rich InGaN layer. Here, the In rich InGaN layer may be an $In_xGa_{1-x}N$ layer (where $0.7\leqq x<1$).

Also, the oxide layer 60 may include N-type impurities. For example, the oxide layer 60 may be an InNO layer or an In rich InGaNO layer including Si.

As described above, light emitting devices according to the embodiments can reduce contact resistance by forming an InNO layer or an In rich InGaNO layer between the second conductive semiconductor layer and the second electrode layer, and enhance light emission efficiency by reducing power consumption and generated heat of the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a first conductive semiconductor layer comprising N-type impurities;
   an active layer on the first conductive semiconductor layer;
   a second conductive semiconductor layer comprising P-type impurities on the active layer;
   an In rich InGaN layer on the second conductive semiconductor layer;
   an In rich InGaNO layer on the In rich InGaN layer; and
   a first electrode layer on the first conductive semiconductor layer and a second electrode layer on the In rich InGaNO layer,
   wherein the In rich InGaNO layer is an oxide layer of an upper portion of the In rich InGaN layer, and
   wherein the In rich InGaN layer is an $In_xGa_{1-x}N$ ($0.7 \leq x < 1$) layer, and the In rich InGaNO layer in an $In_xGa_{1-x}NO$ ($0.7 \leq x < 1$) layer.

2. The light emitting device according to claim 1, comprising a third conductive semiconductor layer between the second conductive semiconductor layer and the In rich InGaNO layer, the third conductive semiconductor layer comprising N-type impurities.

3. The light emitting device according to claim 1, comprising an ITO layer on the In rich InGaNO layer.

4. The light emitting device according to claim 1, wherein the In rich InGaNO layer comprises N-type impurities.

5. The light emitting device according to claim 1, wherein a thickness of the In rich InGaNO layer is about 1 nm to about 100 nm.

* * * * *